United States Patent
Tadayon et al.

(10) Patent No.: US 8,315,587 B2
(45) Date of Patent: Nov. 20, 2012

(54) MECHANICAL TUNING OF A RADIO

(75) Inventors: Shahram Tadayon, Austin, TX (US);
Wade Robert Gillham, Austin, TX (US); Peter J. Vancorenland, Austin, TX (US); Daniel Mark Thompson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 665 days.

(21) Appl. No.: 12/231,184

(22) Filed: Aug. 29, 2008

(65) Prior Publication Data
US 2010/0056089 A1 Mar. 4, 2010

(51) Int. Cl.
*H04H 20/57* (2008.01)

(52) U.S. Cl. ........ 455/333; 455/130; 455/140; 455/147; 455/170.1; 455/196.1; 455/354

(58) Field of Classification Search .................. 455/147, 455/153.1, 170.1, 196.1, 130–355
See application file for complete search history.

(56) References Cited

U.S. PATENT DOCUMENTS

| | | | | |
|---|---|---|---|---|
| 3,739,307 A | * | 6/1973 | Maugans | 334/2 |
| 4,555,808 A | * | 11/1985 | Fujimoto | 455/180.4 |
| 4,574,308 A | * | 3/1986 | Gibson et al. | 348/731 |
| 6,058,296 A | * | 5/2000 | Lian et al. | 455/170.1 |
| 7,127,217 B2 | * | 10/2006 | Tuttle et al. | 455/87 |
| 7,236,750 B2 | * | 6/2007 | Vaidyanathan et al. | 455/84 |
| 7,272,375 B2 | * | 9/2007 | Tuttle et al. | 455/333 |
| 7,321,324 B2 | * | 1/2008 | Piovaccari | 341/143 |
| 2006/0003729 A1 | * | 1/2006 | Tuttle et al. | 455/333 |
| 2007/0049215 A1 | | 3/2007 | Chen et al. | |
| 2008/0049817 A1 | * | 2/2008 | Der et al. | 375/219 |

FOREIGN PATENT DOCUMENTS

CN 1983798 6/2007

OTHER PUBLICATIONS

Miguel-Lopez, Jose "Add a Signal-strength display to an FM-receiver IC", EDN; Sep. 5, 2005.*
TDA7000, "FM Radio Circuit", Phillips, May 1992.*
Phillips Semiconductors; TDA7000 FM radio circuit; May 1992.*
Maxim; MAX1115; Feb. 2002.*
Miguel-Lopez, Jose; Add a signal-strength display to an FM-receiver IC; Sep. 2002; Electronic Design News.*
MAX1115, "Single-Supply, Low-Power, Serial 8-bit ADCs", Maxim; Feb. 2002.*
State Intellectual Property Office, P.R. China, First Office Action mailed Feb. 29, 2012 in Chinese application No. 200910171369.8.

* cited by examiner

*Primary Examiner* — Edward Urban
*Assistant Examiner* — Stacey Sorawat
(74) *Attorney, Agent, or Firm* — Trop, Pruner & Hu, P.C.

(57) ABSTRACT

In one implementation, a receiver may have an analog front end with an amplifier to receive a radio frequency (RF) signal and a mixer to downconvert the signal to a baseband signal. Then, a demodulator may receive the baseband signal and obtain an audio signal therefrom. Still further, a controller may be coupled to receive a control signal corresponding to a variable impedance level, and control a local oscillator coupled to the mixer responsive to the control signal. The variable impedance may be controlled by a user to tune to the channel.

15 Claims, 4 Drawing Sheets

US 8,315,587 B2

MECHANICAL TUNING OF A RADIO

BACKGROUND

Radios are pervasive in many different forms, including portable radios, mobile radios in cars, radios in cellular telephones, as well as radios for the home, such as clock radios, stereo receivers and so forth. Many of today's radios operate using digital tuning, in which a user can select a desired-channel digitally, e.g., using control buttons to select a given digital representation of the channel. However, many radios still provide a mechanical analog control such as a tuning wheel, where a user rotates the wheel to a selected position that represents a given channel. In such mechanically tuned radios, typically the tuning wheel is coupled to a tuning capacitor, which is a relatively expensive electronic component that provides a variable capacitance having a high degree of accuracy and range, and that in turn controls a tuning circuit of the radio. While easy to use, such an implementation can raise system costs and increase the size of a design, as it can take up a significant amount of real estate, both on a circuit board itself, as well as its height extending from the board. Furthermore, additional components of a tuning circuit used in connection with the tuning circuit such as capacitances, inductances, filters, and so forth are needed and can require factory alignment for fine tuning, raising the bill of material and time of manufacture and thus increasing manufacturing costs.

SUMMARY OF THE INVENTION

In one aspect, the present invention includes an apparatus having a radio receiver that can tune to a radio channel indicated by a user. More specifically, the receiver may have an analog front end with an amplifier to receive a radio frequency (RF) signal and a mixer to downconvert the signal to a baseband signal. Then, a demodulator may receive the baseband signal and obtain an audio signal therefrom. Still further, a controller may be coupled to receive a control signal corresponding to a variable impedance level, and control a local oscillator coupled to the mixer responsive to the control signal. The variable impedance may be controlled by the user to tune to the channel. In this way, the apparatus can avoid the need for an expensive external varactor and associated factory alignment procedures. In a particular implementation, a single chip integrated circuit radio receiver can be coupled to an external variable impedance. As one such example, the variable impedance may be a variable resistance coupled to a mechanical tuning mechanism to provide a variable voltage responsive to a user selection of the mechanism.

Yet another aspect is directed to a method for outputting a radio channel from a radio receiver. In this aspect, the method may include receiving information regarding a variable impedance controlled by a user to tune to the channel, determining a tuning value for tuning of a local oscillator (LO) based on the information, transmitting the tuning value to the LO and outputting a LO signal based on the tuning value, and receiving and downconverting a RF signal using the LO signal to output the radio channel. In one implementation, the method may be performed using a microcontroller of a radio receiver, such as the single chip receiver discussed above.

DETAILED DESCRIPTION

In various embodiments, a mechanically tuned radio can be implemented without the need for an external varactor or factory alignment, reducing a bill of material, manufacturing costs and size consumed for a given design. In various implementations, a variable impedance may be provided that is coupled to a tuning mechanism, e.g., a tuning wheel that is user controlled. This variable impedance may be set at a given level based on the user control. Information regarding the level of the variable impedance can be provided to a controller of the radio, which can in turn control the radio's frequency based on this information.

Implementations can be used in connection with AM radios (including long wave, medium wave and short wave frequencies), FM radios or a combined AM/FM radio. As will be discussed further below, different variable impedances can be used, for example, a variable resistance such as a potentiometer or a variable capacitance. Such off-chip variable impedances may be much smaller and cheaper than an external varactor such as used in conventional mechanically tuned radios as a reduced range and accuracy is sufficient. Further, this minimal capacitance need not be calibrated at the factory or require additional components as would an external varactor. Different manners of controlling tuning can be used depending on the type of impedance used, as well as the mode of operation, i.e., FM or AM mode.

Figure 1:
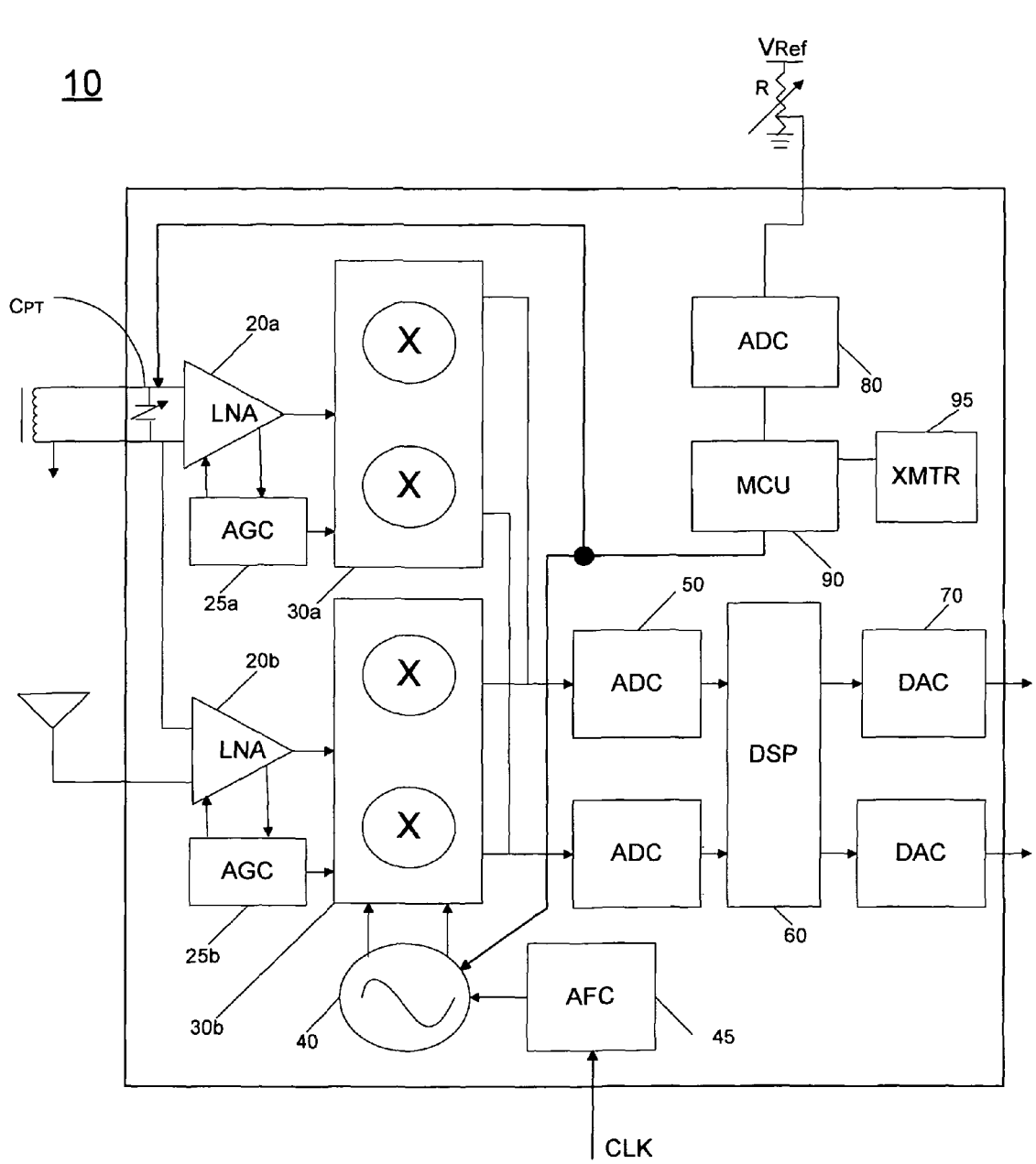
FIG. 1 is a block diagram of a radio receiver in accordance with one embodiment of the present invention.

Referring now to FIG. 1, shown is a block diagram of a radio receiver in accordance with one embodiment of the present invention. As shown in FIG. 1, receiver 10, which may be a fully integrated complementary metal oxide semiconductor (CMOS) integrated circuit (i.e., a single die IC), includes circuitry to receive incoming radio frequency (RF) signals, downconvert them to baseband frequency, perform demodulation and provide audio signals therefrom. As shown, incoming signals, which may be received from an AM or FM antenna, are provided to an analog front end that includes low noise amplifiers (LNAs) $20_a$ and $20_b$, respectively, each of which may be controlled in turn by automatic gain control (AGC) circuits $25_a$ and $25_b$. The amplified incoming signals are provided to respective mixers $30_a$ and $30_b$, which perform a mixing operation to downconvert the RF signals to a lower frequency, e.g., an intermediate frequency (IF), such as a 10.7 megahertz (MHz) IF for FM and a 455 kilohertz (kHz) IF for AM, a low intermediate frequency (low-IF), zero-IF or baseband frequency.

As shown in FIG. 1, the RF signals are mixed with a local oscillator (LO) signal output from a LO 40. The frequency of LO 40 may be controlled using an automatic frequency control circuit 45 or a PLL, which may receive an incoming clock signal such as may be generated by an off-chip crystal oscillator. Still further, fine tuning of LO 40 may be under control of a microcontroller unit (MCU) 90, details of which will be discussed further below.

Still referring to FIG. 1, the downmixed signals are provided to an analog-to-digital converter (ADC) 50 that in turn provides digitized signals to a digital signal processor (DSP) 60, which may perform various signal processing and demodulation operations to obtain the message content in the incoming signals. In turn, digitized message information may be provided to a digital-to-analog converter (DAC) 70, which provides output audio signals corresponding to the message content.

As further shown in FIG. 1, a variable resistance, i.e., a potentiometer R, may be coupled to IC 10. As seen, this potentiometer is coupled between a reference voltage and a ground potential. The potentiometer may be controlled by a tuning mechanism of a radio incorporating IC 10. For example, a clock radio, mobile radio, boom box or so forth may have a manual tuning wheel to enable mechanical tuning, rather than by using a digitally controlled tuning mechanism. Accordingly, based on the manual control, a variable voltage is provided to an ADC 80, which converts this voltage into a digital representation, e.g., a digital control signal that in turn is provided to MCU 90. As will be discussed further, MCU 90 may control the fine tuning of LO 40 based on this control signal to thus enable the radio to tune to the desired channel. Depending on the mode of operation MCU 90 may further control front end tuning mechanisms, as will be described below.

Note in the embodiment of FIG. 1, a pre-select tuning mechanism may be coupled to the input of LNA $20_a$. That is, for AM mode a pre-tuning capacitance $C_{PT}$ may be controlled to enable tuning to a desired frequency. As shown in FIG. 1, MCU 90 may provide a control signal to control this variable capacitance. In one such embodiment, the variable capacitance may be formed of a digitally controlled capacitor array, in which the control signal from MCU 90 may be a digital word, with each bit controlling a switching transistor such as a metal oxide semiconductor field effect transistor (MOSFET) to switch in or out a selected amount of capacitance. To further aid in pre-tuning, a pre-select tuning inductance (which may be off-chip) can be coupled to the pre-select capacitance.

As further shown in FIG. 1, MCU 90 may further be coupled to a transmitter circuit 95. In some implementations, IC 10 may be a combined transmitter and receiver. However, in other implementations IC 10 may be primarily a receiver, with a small, minimally powered transmitter circuit 95, which may be provided to enable transmission of a ping signal under control of MCU 90. That is, for purposes of fine tuning, MCU 90 may instruct transmitter circuit 95 to turn on and transmit a ping signal at a given frequency. This transmission may be at extremely low power levels, as it need only be received by the associated antennas. When received, this ping signal may be processed as any other radio signal. However, the frequency of the signal may be determined by MCU 90. Accordingly, MCU 90 may determine an offset between the transmitted ping signal from transmitter circuit 95 and the incoming ping signal. Such offset may be indicative of a tuning variation, e.g., due to an incoming clock signal that is slightly different than a predetermined value, or due to a process voltage or temperature (PVT) changes or other such reasons. While described as using a transmitter circuit for purposes of determining any frequency offset, embodiments are not limited in this regard and in other implementations, other manners of detecting a frequency offset can be performed. While shown with this particular implementation in the embodiment of FIG. 1, the scope of the present invention is not limited in this regard.

Figure 2:
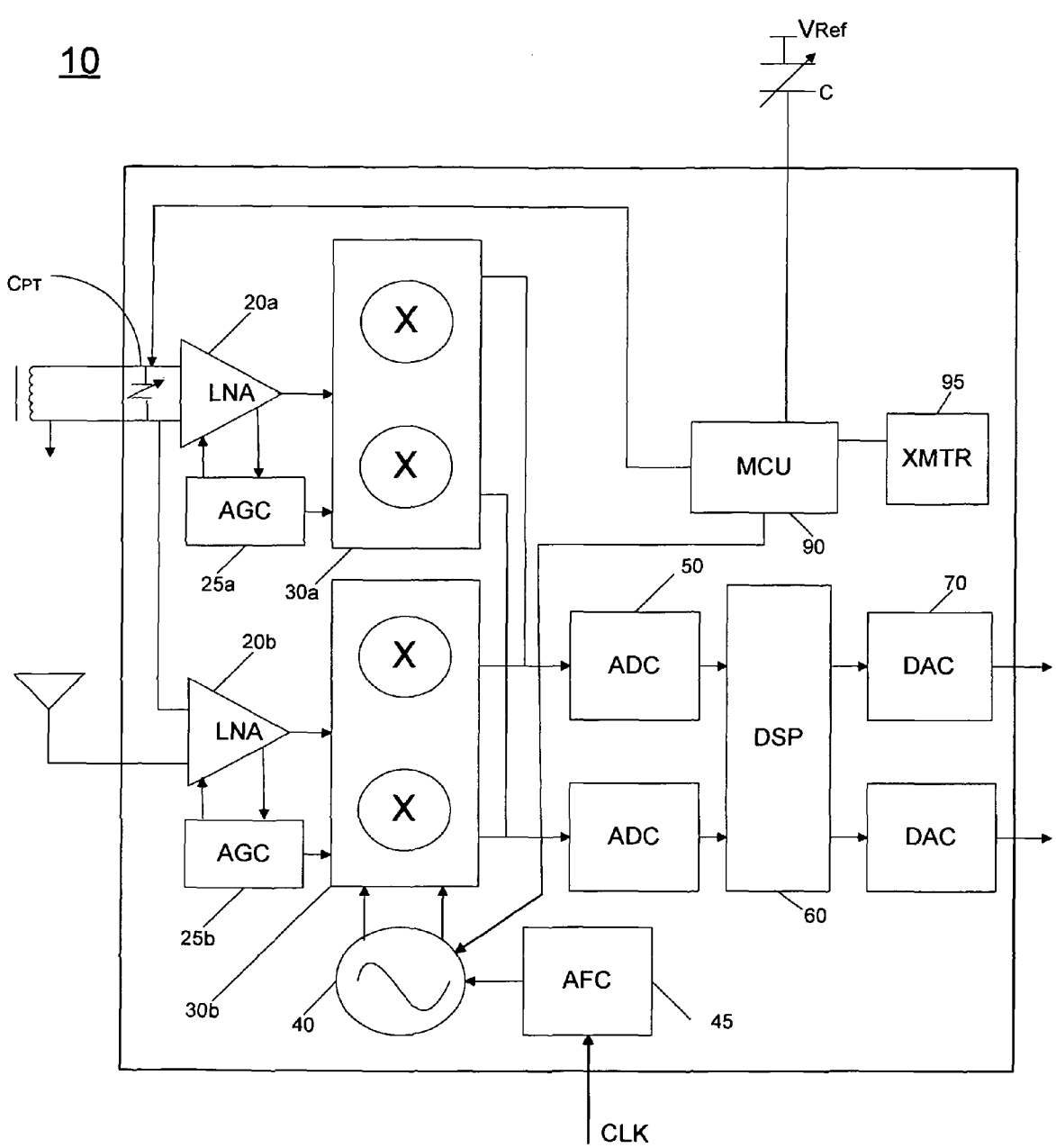
FIG. 2 is a block diagram of a radio receiver in accordance with another embodiment of the present invention.

In other implementations, rather than a variable resistance, a variable capacitance can be used. Referring now to FIG. 2, shown is a block diagram of another embodiment of the present invention in which the variable impedance mechanism is a variable capacitance. In contrast to an external varactor, this variable capacitance can be of minimal range and accuracy, and need not be factory aligned. As shown in FIG. 2, IC 10', which may be adapted similarly to that of IC 10 of FIG. 1, is present. An off-chip variable capacitance, C, may be coupled to a tuning mechanism, e.g., a tuning wheel (not shown for ease of illustration in FIG. 2). Based upon the user's control of the tuning wheel, different capacitances may be provided. Note in the embodiment of FIG. 2, there is no need for an ADC, as the variable capacitance itself may be coupled directly MCU 90. Accordingly, MCU 90 may be configured to sense the value of the variable capacitance as a control signal. This control signal, based on the capacitance value, then may be used to determine the desired frequency for tuning.

Figure 3:
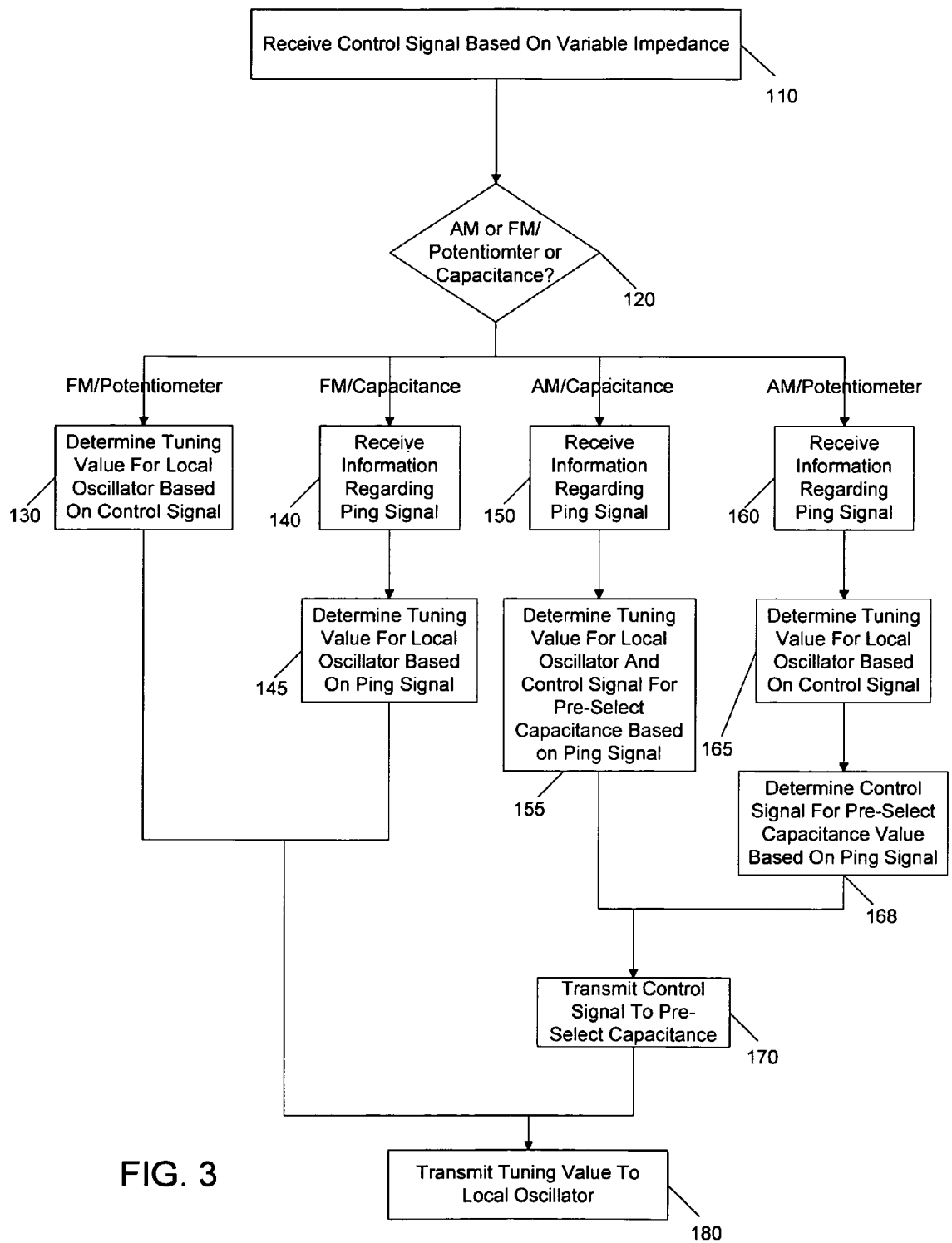
FIG. 3 is a flow diagram of a method in accordance with one embodiment of the present invention.

Referring now to FIG. 3, shown is a flow diagram of a method in accordance with one embodiment of the present invention. As shown in FIG. 3, method 100 may be implemented by, e.g., an MCU or other controller to enable selection of a desired radio channel by a user via a mechanical tuning mechanism such as a tuning wheel or other such apparatus.

As shown in FIG. 3, method 100 may begin by receiving a control signal (block 110). More specifically, an MCU may receive a control signal based on a variable impedance that is at a given level depending upon a user's selection of a desired frequency. As described above, the variable impedance may be a potentiometer or controllable capacitance that is coupled to a tuning wheel. The control signal may be provided in digital form, e.g., the output of an ADC in the case of a potentiometer, while the control signal may be a capacitance value measured by the MCU where the variable impedance is an off-chip capacitance.

In addition, the MCU may further determine whether the mode of operation is AM or FM and the type of impedance (diamond 120). If FM mode is determined and the controllable impedance is a potentiometer, the MCU may determine an oscillation frequency for an LO based on the control signal (block 130). In this case, the voltage corresponding to the variable resistance determines the desired frequency. In one embodiment, the LO may be set at an IF apart from the desired frequency. For example for an FM range of 88-108 MHz, and where the potentiometer is at 50% (based on the ADC output), the desired frequency is 98.0 MHz. If the IF is set at 200 kHz, the LO may be set to either 97.9 MHz or 98.2 MHz, depending on high-side or low-side injection. The determined tuning value may be transmitted to the LO (or control circuitry associated therewith, such as an AFC circuit) to enable control of the LO at the desired frequency such that the radio receiver tunes to the selected frequency (block 180).

If instead at diamond 120 it is determined that FM mode is selected but a variable capacitance is present, the MCU may further receive information regarding a ping signal (block 140). More specifically, as discussed above, a ping signal that can be generated in a single chip IC or via an external mechanism can be received by the IC and processed to provide frequency information back to the MCU. In this way, the MCU can determine the value of the external variable capacitance and what percentage it is as compared to the maximum value. For example, the MCU may store information regarding the external variable capacitance range and the received ping value of the external capacitance. Based on the stored information and the determined capacitance level, the MCU determines the percentage of the turn and uses this information to set the LO. For example, when the external capacitance is at its maximum value, the desired station is at 108 MHz, and when at its minimum, the desired station is at 88 MHz. Tuning to the desired channel using a determined tuning value for the LO may be performed as above at block 130, however, here the tuning value is based on the information from the ping signal (block 145), and this tuning value is sent to the LO (block 180).

If AM mode instead is determined (and an external variable capacitance is present) at diamond 120, control passes to block 150. For AM reception, a radio receiver may have a front end variable (i.e., pre-select) capacitance, such as that shown in FIGS. 1 and 2. To enable reception of the desired channel, the MCU may thus determine a value for this pre-select capacitance based on the received ping signal (blocks 150 and 155). Specifically, the ping signal is used to determined the value of an external inductor and any stray capacitance in order to control the pre-select filter. Further based on the ping signal, the tuning value for the LO may also be determined, as described above for the FM mode (block 155). The MCU then transmits a control signal for the pre-select capacitance (block 170), and the tuning value to the LO (block 180).

If instead the external impedance for AM mode is a potentiometer, the MCU may determine the tuning value for the LO based on the control signal (block 165), as discussed above regarding the FM mode. The MCU may also determine the preselect capacitance control signal based on the ping signal (block 168) (which is received at block 160). Then as above in blocks 170 and 180, the pre-select capacitance control signal and the tuning value may be provided to the pre-select capacitance and the LO, respectively. While shown with this particular implementation in the embodiment of FIG. 3, the scope of the present invention is not limited in this regard.

Figure 4:
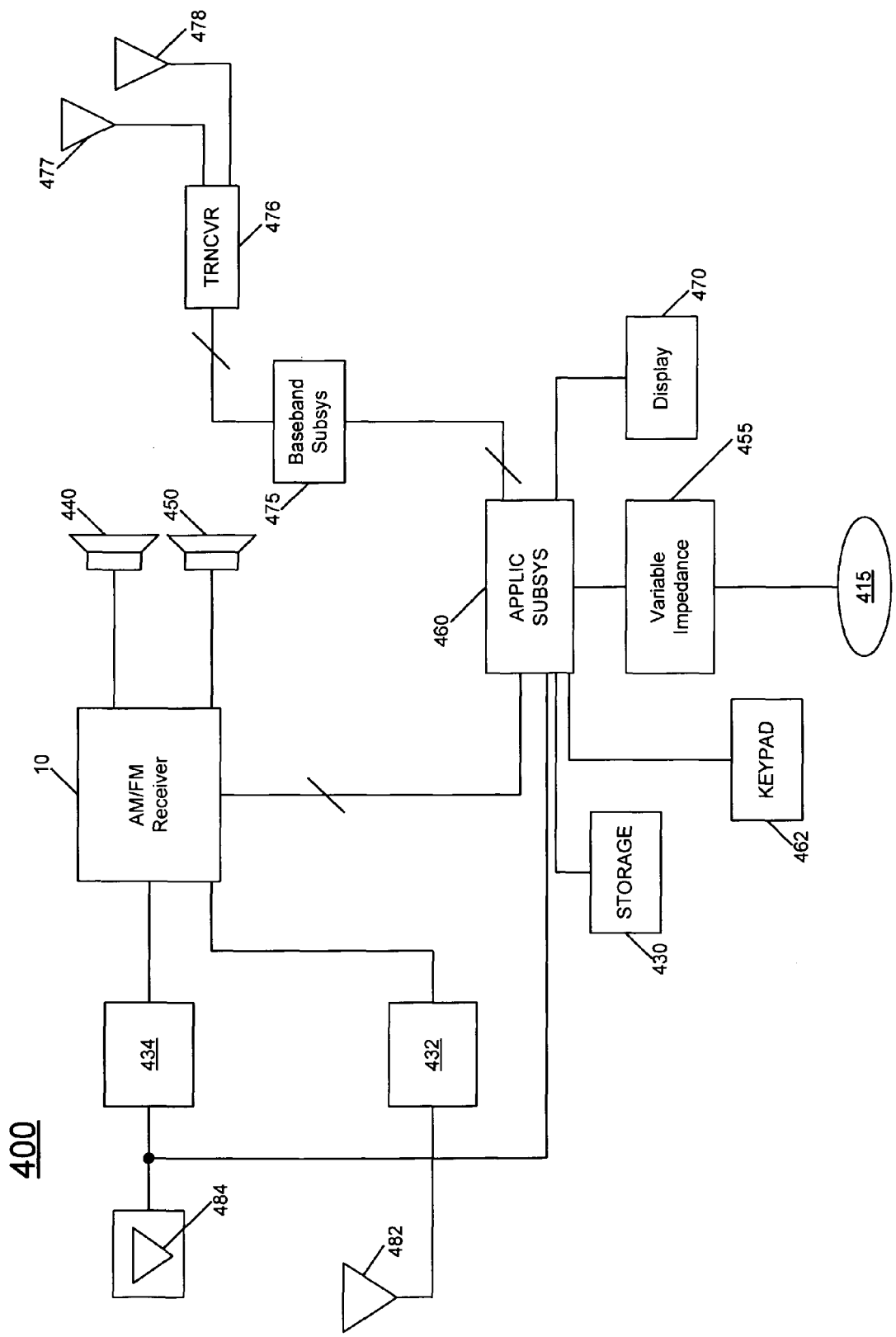
FIG. 4 is a block diagram of a system in accordance with an embodiment of the present invention.

Referring to FIG. 4, in accordance with some embodiments of the invention, an AM/FM receiver 10 (such as an implementation of that shown in the embodiment of FIG. 1) may be part of a multimedia device 400. As examples, the device 400 may be a clock radio, a portable device such as a dedicated MP3 player, a cellular telephone or PDA with audio capabilities, or other such devices.

Among its other functions, the device 400 may store digital content on a storage 430, which may be a flash memory or hard disk drive, as a few examples. The device 400 generally includes an application subsystem 460 that may, for example, receive input from a keypad 462 of the wireless device 400 and display information on a display 470. Furthermore, the application subsystem 460 may generally control the retrieval and storage of content from the storage 430 and the communication of, e.g., audio with the AM/FM receiver 10. As shown, AM/FM receiver 10 may be directly connected to speakers 440 and 450 for output of audio data. As depicted in FIG. 4, the AM/FM receiver 10 may be coupled by a matching network 432 to an FM receiver antenna 482 and may be coupled by a matching network 434 to an AM receiver antenna 484, which can be tunable or programmable, e.g., via application subsystem 460 that provides control information to control a pre-selection capacitance and/or inductance of matching network 434.

As further shown in FIG. 4, application subsystem 460 may further be coupled to a variable impedance 455, e.g., a potentiometer or variable capacitance that is mechanically controlled by a user, e.g., via a tuning wheel 415. Information regarding the variable impedance either by way of voltage or capacitance is provided to application subsystem 460, which may in turn control both an LO of receiver 10 and/or matching network 434 to enable tuning to a desired channel.

In accordance with some embodiments of the invention, device 400 may have the ability to communicate over a communications network, such as a cellular network. For these embodiments, the device 400 may include a baseband subsystem 475 that is coupled to the application subsystem 460 for purposes of encoding and decoding baseband signals for this wireless network. Baseband subsystem 475 may be coupled to a transceiver 476 that is connected to corresponding transmit and receive antennas 477 and 478. In some implementations, transceiver 476 may be programmed under control of application subsystem 460 to transmit a ping signal, such as discussed above. While the scope of the present invention is not limited in this regard, at least some implementations may be incorporated in a computer-readable storage medium such as instructions present in a non-volatile storage within or accessible by application subsystem 460 to enable the subsystem to control frequency selection based on a measure of variable impedance 415.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit (IC) comprising: a single chip integrated circuit radio receiver including: an analog front end having an amplifier to receive a radio frequency (RF) signal and a mixer to downconvert the RF signal to a baseband signal; a demodulator to receive the baseband signal and obtain an audio signal therefrom; and a controller to receive a control signal based on and corresponding to a level of a single potentiometer coupled to the IC, wherein the single potentiometer is coupled to a manual tuning wheel of a radio including the IC, the mechanical tuning wheel to be manually adjusted by a user to tune to a radio channel, the single potentiometer to couple between a reference voltage and a ground potential, the controller to control a local oscillator coupled to the mixer responsive to the control signal, the controller to further control a pre-selection capacitance responsive to a ping signal transmitted from and received and processed by an antenna coupled to the single chip integrated circuit radio receiver, wherein the controller is to cause transmission of the ping signal to enable the controller to determine a frequency offset between the transmitted ping signal and the received ping signal.

2. The integrated circuit of claim 1, wherein the integrated circuit further includes an analog-to-digital converter (ADC) coupled to the single potentiometer and to generate the control signal therefrom, the ADC separate from a second ADC coupled between the radio receiver and the demodulator.

3. The integrated circuit of claim 2, wherein the single potentiometer is to enable the tuning without an external varactor that is factory aligned.

4. The integrated circuit of claim 2, wherein the control signal comprises a digital signal and the controller comprises a microcontroller unit (MCU) of the IC.

5. The integrated circuit of claim 4, wherein the MCU is to further control the pre-select capacitance coupled to the amplifier responsive to the ping signal transmitted from and received by the antenna, the front end variable capacitance and an external inductance coupled thereto to pre-select the radio channel.

6. The integrated circuit of claim 1, wherein the controller is to instruct a transmission circuit to transmit the ping signal to be transmitted from and to be received by the antenna, the controller to determine a control value for an external inductance and an external capacitance based on the received ping signal.

7. The integrated circuit of claim 6, wherein the controller is to control the pre-select capacitance corresponding to the external capacitance coupled to the amplifier based on the received ping signal.

8. A system comprising:
a mechanical tuning mechanism to enable a user to select a radio channel;
a single variable resistance coupled to the mechanical tuning mechanism to provide a variable voltage responsive to the user selection, the single variable resistance to couple between a reference voltage and a ground potential;
a single chip integrated circuit radio receiver coupled to the single variable resistance and having an analog portion including a mixer to downconvert a radio frequency (RF) signal to a baseband signal, a digital portion to receive the baseband signal and demodulate the baseband signal, a microcontroller to receive an indication of the variable voltage and to control a frequency of the downconversion responsive thereto, and an analog-to-digital converter (ADC) coupled to the single variable resistance to provide a digitized representation of the variable voltage to the microcontroller; and
a pre-selection capacitance coupled to an input of the analog portion, wherein the pre-selection capacitance is controlled by the microcontroller responsive to a ping signal transmitted from and received and processed by an antenna coupled to the radio receiver, wherein the microcontroller is to cause transmission of the ping signal to enable the microcontroller to determine a frequency offset between the transmitted ping signal and the received ping signal.

9. The system of claim 8, wherein the single variable resistance is to enable the user selection without a factory aligned external varactor in the system.

10. A method comprising:
receiving information regarding a single variable impedance manually controlled by a user via a tuning wheel to tune to a radio channel in a microcontroller of a single die radio receiver;
determining in the microcontroller a tuning value for tuning of a local oscillator (LO) based on the information;
transmitting the tuning value to the LO and outputting a LO signal based at least in part on the tuning value;
receiving and downconverting a radio frequency (RF) signal using the LO signal to output the radio channel; and
receiving an incoming ping signal transmitted from a first antenna coupled to the single die radio receiver and received by a second antenna coupled to the single die radio receiver, and determining a value of the single variable impedance based on the incoming ping signal.

11. The method of claim 10, further comprising determining a pre-select value for a pre-selection capacitance coupled to an AM antenna based on the incoming ping signal.

12. The method of claim 11, further comprising, if a mode of operation is AM, controlling the pre-selection capacitance based on the pre-select value.

13. The method of claim 12, further comprising transmitting a digital control signal to the pre-select capacitance, and coupling a selected amount of capacitance to the AM antenna based on the digital control signal.

14. The method of claim 10, further comprising receiving a digital control signal responsive to the variable impedance in the microcontroller and transmitting the tuning value to the LO from the microcontroller.

15. The method of claim 14, further comprising controlling a front end pre-select capacitance responsive to the incoming ping signal.

* * * * *